(12) United States Patent
Fuergut et al.

(10) Patent No.: US 10,043,782 B2
(45) Date of Patent: Aug. 7, 2018

(54) ELECTRONIC DEVICE PACKAGE HAVING A DIELECTRIC LAYER AND AN ENCAPSULANT

(71) Applicant: Infineon Technologies AG, Neubiberg (DE)

(72) Inventors: Edward Fuergut, Dasing (DE); Holger Doepke, Sinzing (DE); Olaf Hohlfeld, Warstein (DE); Michael Juerss, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/470,960

(22) Filed: Mar. 28, 2017

(65) Prior Publication Data

US 2017/0287880 A1    Oct. 5, 2017

(30) Foreign Application Priority Data

Apr. 4, 2016  (DE) .................. 10 2016 106 137

(51) Int. Cl.
| | |
|---|---|
| *H01L 21/56* | (2006.01) |
| *H01L 23/31* | (2006.01) |
| *H05K 3/28* | (2006.01) |
| *H01L 25/07* | (2006.01) |
| *H01L 21/52* | (2006.01) |
| *H01L 23/29* | (2006.01) |

(Continued)

(52) U.S. Cl.
CPC ............ *H01L 25/072* (2013.01); *H01L 21/52* (2013.01); *H01L 21/565* (2013.01); *H01L 23/295* (2013.01); *H01L 24/05* (2013.01); *H01L 21/563* (2013.01); *H01L 23/3135* (2013.01); *H01L 23/3142* (2013.01); *H01L 23/552* (2013.01); *H01L 23/562* (2013.01); *H01L 24/06* (2013.01); *H05K 3/282* (2013.01); *H05K 2201/09872* (2013.01); *H05K 2203/1377* (2013.01)

(58) Field of Classification Search
CPC ....... H01L 24/05; H01L 24/06; H01L 21/563; H01L 23/552; H01L 23/562; H01L 23/3135; H01L 23/3142; H05K 3/282; H05K 3/284; H05K 2203/1377; H05K 2201/09872

See application file for complete search history.

(56) References Cited

U.S. PATENT DOCUMENTS

| | | | |
|---|---|---|---|
| 4,828,901 A | 5/1989 | Wank et al. | |
| 5,164,816 A | 11/1992 | Nishizawa et al. | |

(Continued)

FOREIGN PATENT DOCUMENTS

| | | |
|---|---|---|
| DE | 10318078 B4 | 3/2007 |
| DE | 10303449 B4 | 4/2007 |
| WO | 2015000591 A2 | 1/2015 |

*Primary Examiner* — David Zarneke
(74) *Attorney, Agent, or Firm* — Murphy, Bilak & Homiller, PLLC

(57) ABSTRACT

A method for fabricating an electronic device package includes providing a carrier, disposing a semiconductor chip onto the carrier, the semiconductor chip having a contact pad on a main face thereof remote from the carrier, applying a contact element onto the contact pad, applying a dielectric layer on the carrier, the semiconductor chip, and the contact element, and applying an encapsulant onto the dielectric layer.

12 Claims, 6 Drawing Sheets

(51) Int. Cl.
  *H01L 23/552* (2006.01)
  *H01L 23/00* (2006.01)

(56) References Cited

U.S. PATENT DOCUMENTS

| | | | | |
|---|---|---|---|---|
| 5,165,956 A | * | 11/1992 | Wong | H01L 23/296 |
| | | | | 257/E23.12 |
| 5,554,684 A | | 9/1996 | Choi et al. | |
| 5,622,898 A | * | 4/1997 | Zechman | H01L 23/293 |
| | | | | 257/E23.025 |
| 6,107,184 A | * | 8/2000 | Mandal | B05D 1/60 |
| | | | | 257/E21.259 |
| 6,121,130 A | * | 9/2000 | Chua | H01L 21/02137 |
| | | | | 257/E21.242 |
| 7,115,496 B2 | | 10/2006 | Brintzinger et al. | |
| 7,211,468 B2 | | 5/2007 | Auburger et al. | |
| 9,561,953 B1 | * | 2/2017 | Elian | H01L 21/563 |
| 9,656,350 B2 | * | 5/2017 | Astle | B23K 26/362 |
| 9,780,061 B2 | * | 10/2017 | Gabler | H01L 24/48 |
| 2003/0013235 A1 | | 1/2003 | Featherby et al. | |
| 2006/0199951 A1 | | 9/2006 | Wang et al. | |
| 2006/0278971 A1 | * | 12/2006 | Barnes | H01L 21/4853 |
| | | | | 257/701 |
| 2007/0200258 A1 | * | 8/2007 | Mahler | H01L 23/3142 |
| | | | | 257/787 |
| 2007/0262426 A1 | * | 11/2007 | Mahler | C08G 18/72 |
| | | | | 257/669 |
| 2010/0140778 A1 | * | 6/2010 | Weekamp | H01L 21/568 |
| | | | | 257/690 |
| 2011/0039050 A1 | * | 2/2011 | Hogg | A61N 1/375 |
| | | | | 428/76 |
| 2011/0198115 A1 | * | 8/2011 | Azuma | H01L 23/3135 |
| | | | | 174/260 |
| 2011/0309375 A1 | * | 12/2011 | Kato | H01L 21/565 |
| | | | | 257/77 |
| 2014/0220742 A1 | | 8/2014 | Hosseini et al. | |
| 2015/0041967 A1 | | 2/2015 | Wachter et al. | |
| 2015/0146399 A1 | * | 5/2015 | Viswanathan | H01L 24/83 |
| | | | | 361/785 |
| 2016/0365295 A1 | * | 12/2016 | Hoegerl | H01L 21/561 |

* cited by examiner

ELECTRONIC DEVICE PACKAGE HAVING A DIELECTRIC LAYER AND AN ENCAPSULANT

TECHNICAL FIELD

This disclosure relates in general to a method for fabricating an electronic device package, to an electronic device package, and to an electronic voltage converter module. The disclosure relates in particular to an electronic device package like, for example, a high power module comprising a dielectric layer and an encapsulant, both acting together for improving performance and reliability.

BACKGROUND

In many technical areas it is necessary to employ voltage or current converters such as DC/DC converters, AC/DC converters, DC/AC converters, or buck converters. For future energy supply, for example, smart electricity grids connect decentralized renewable energy sources. In case of wind energy the turbines generate AC power, but for transmission DC power with lower energy losses is needed. Therefore, smart grids consist essentially of high voltage direct current transmission units with corresponding converter stations, where several tens of thousands of high power modules are required. Also in other technical areas, such converters are used in order to generate the currents, voltages and/or frequencies that are intended to be used by an electronic circuit such as a motor drive circuit, for example. The converter circuits in general comprise one or a plurality of half-bridge circuits, wherein each can be provided by two semiconductor power switches such as, for example, power MOSFET components or power insulated gate bipolar transistors (IGBT) and further components such as, for example, diodes which are connected in parallel with the transistor components, and passive components such as, for example, inductances and capacitances. Electronic modules containing such kinds of electrical circuits can be exposed sometimes to very harsh conditions like, for example, high humidity.

SUMMARY

In accordance with one aspect of the disclosure a method for fabricating an electronic device package comprises providing a carrier, disposing at least one semiconductor chip onto the carrier, the semiconductor chip comprising at least one contact pad on a main face thereof remote from the carrier, applying a contact element onto the contact pad, applying a dielectric layer onto the carrier, the semiconductor chip, and the contact element, and applying an encapsulant onto the dielectric layer.

In accordance with one aspect of the disclosure an electronic device package comprises at least one semiconductor chip comprising at least one contact pad on a main face thereof, a contact element disposed on the contact pad, a dielectric layer disposed on the semiconductor chip and the contact element, and an encapsulant disposed on the dielectric layer.

In accordance with one aspect of the disclosure an electronic voltage converter module comprises a plurality of semiconductor transistor chips, each one of the semiconductor transistor chips comprising at least one contact pad on a main face thereof, a contact element disposed on each one of the contact pads, a dielectric layer disposed on the semiconductor transistor chips and the contact elements, and an encapsulant disposed on the dielectric layer, wherein the semiconductor transistor chips are electrically interconnected to form one or more of a motor drive circuit, a half-bridge circuit, an AC/AC converter circuit, a DC/AC converter circuit, a DC/DC converter circuit, and a buck converter circuit.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

The elements of the drawings are not necessarily to scale relative to each other. Like reference numerals designate corresponding similar parts.

DETAILED DESCRIPTION

Figure 1:
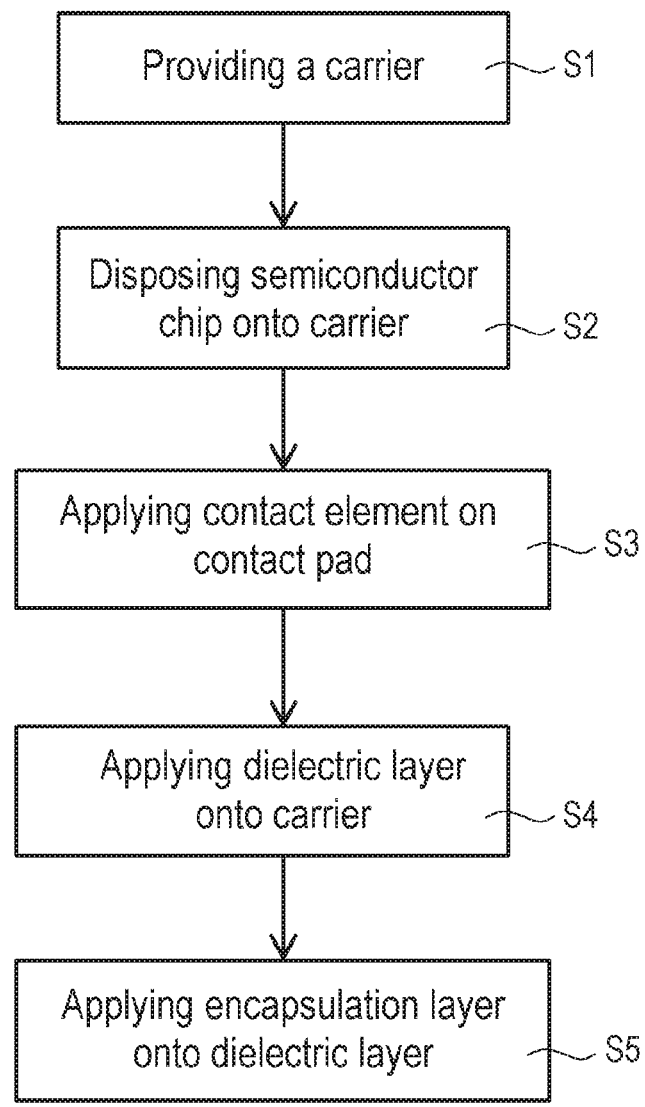
FIG. 1 shows a flow diagram for illustrating a method for fabricating an electronic; device package according to a first aspect.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present disclosure is defined by the appended claims.

The examples of a method for fabricating an electronic device package, of an electronic device package and of an electronic voltage converter module may use various types of semiconductor devices. The examples may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The examples may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures. Insofar as the transistor chips are configured as power transistor chips and if in addition also driver chips are integrated into the package, the examples of an electronic device package disclosed further below can be classified as intelligent power modules (IPM).

In any case the electronic devices, e.g. the semiconductor dies or semiconductor chips, may comprise contact elements or contact pads on one or more of their outer surfaces wherein the contact elements are electrically connected with the electrical circuit, e.g. the transistor, of the respective semiconductor die and serve for electrically connecting the semiconductor die to the outside. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned or further materials so as to create, for example, a stack of NiPdAu.

The examples of an electronic device package may comprise an encapsulant or encapsulating material having the semiconductor transistor chips embedded therein. The encapsulating material can be any electrically insulating material like, for example, any kind of molding material, any kind of resin material, or any kind of epoxy material, a bismaleimide, or a cyanate ester. The encapsulating material can also be a polymer material, a polyimide material, a thermoplast material, a ceramic material, and a glass material. The encapsulating material may also comprise any of the above-mentioned materials and further include filler materials embedded therein like, for example, thermally conductive increments. These filler increments can be made of SiO, Al2O3, ZnO, AlN, BN, MgO, Si3N4, or ceramic, or a metallic material like, for example, Cu, Al, Ag, or Mo. Furthermore, the filler increments may have the shape of fibers and can be made of carbon fibers or nanotubes, for example.

Insofar as methods for fabricating an electronic device package are described as having a specific order of method steps, it should be mentioned that any other appropriate order of the method steps may be employed by the skilled person. It should further be mentioned that any comments, remarks or features mentioned in connection with a described method are to be understood as also disclosing a device being obtained or resulting from such comments, remarks or features, even if such a device is not explicitly described or illustrated in the figures. Furthermore, any comments, remarks or features mentioned in connection with a device are to be understood as also disclosing a method step for providing or fabricating the respective device feature.

FIG. 1 shows a flow diagram for illustrating a method for fabricating an electronic device package according to a first aspect. The method comprises providing a carrier (s1), disposing at least one semiconductor chip onto the carrier, the semiconductor chip comprising at least one contact pad on a main face (s2), applying a contact element onto the contact pad (s3), applying a dielectric layer onto the carrier, the semiconductor chip, and the contact element (s4), and applying an encapsulant onto the dielectric layer (s5).

According to an example of the method according to the first aspect, the material of the dielectric layer is chosen such that it may function in a best possible way as a stress buffer between the semiconductor chip and the encapsulation layer, and furthermore that it may in a best possible way function as a barrier against humidity which may penetrate from the environment, and also to function in a best possible way to electrically isolate the semiconductor chip, i.e. the electrical devices disposed in the semiconductor chip.

According to an example of the method according to the first aspect, the dielectric layer is one or more of a polymer layer, a polyimide layer, a parylene layer, a polybenzoxazole (PBO) layer, a resin layer, in particular an epoxy resin layer, a silicone layer, a spin-on glass layer, and also hybrid materials, i.e. compound materials of one or more of the above mentioned materials like, for example, a compound of materials exhibiting similar, different, or overlapping properties, e.g. PBO and a polyimide. In particular, such hybrid materials could be used which combine opposed or contrary properties e.g. organic and inorganic materials. The dielectric layer can also be a semiconductor oxide or semiconductor nitride or semiconductor oxynitride layer like, e.g. a SiO, a SiN or a SiON layer.

According to an example of the method according to the first aspect, the dielectric layer does not include any filler materials or increments, but is essentially a homogenous layer of any one of the above-mentioned materials. It is, however, likewise possible that the dielectric layer includes filler materials or increments, wherein the filler increments can be selected such that they fulfill particular functions like, for example, ion catching, flame inhibiting, softening or plasticizing.

According to an example of the method according to the first aspect, the dielectric layer comprises one or more of the following properties: a dielectric constant in a range from 2 to 5, a dielectric strength in a range from 100 to 500 V/$\mu$m, a dissipation factor in a range from 0.005 to 0.03, and a modulus of elasticity in a range from 0.1 to 5.0 GPa, wherein the dissipation factor is a measure of the dielectric losses in an electrically insulating material when used in an alternating field.

According to an example of the method of the first aspect, applying the dielectric layer comprises depositing the dielectric layer wherein depositing the dielectric layer comprises one or more of spin coating, spray coating or jet coating or electrostatic and/or atomizing coating, wave coating, potting, filling, laminating, in particular vacuum laminating, dipping, physical vapor deposition (PVD), chemical vapor depositing (CVD), or printing.

According to an example of the method according to the first aspect, applying the dielectric layer further comprises heating or curing the deposited dielectric layer. According to a further example thereof, a heating temperature is in a range up to 500° C., in particular from 80° C. to 400° C., in particular from 150° C. to 280° C., and the heating time is in a range up to 5 h, in particular from 0.5 h to 3.0 h, in particular 1 h to 2 h. According to a further example thereof, before the heating a pre-heating or pre-bake can be carried out at, for example, a pre-heating temperature in a range from 80° C. to 140° C., in particular from 100° C. to 120° C., and at a heating time in a range up to 20 min. The pre-heating step may prove to be advantageous for dehumidifying the deposited dielectric layer and to evaporate the solvent.

According to an example of the method according to the first aspect, applying the dielectric layer comprises applying a stack of two or more dielectric layers of one or more of different materials or of different properties. Hence, either the materials of the two or more dielectric layers are different or the materials of the two or more dielectric layers are similar or equal but their properties are different. If the materials are different from each other then, in general, also their properties will be different. If the materials are similar or equal, their properties can be different. For example, in the case of polyimide layers or other kinds of polymeric layers, they can be treated in a different way after deposition so that the degree of forming a network of polymers or atoms, in particular the polymerisation or of cross-linking of the molecules, in case of a polyimide layer the imidization of the polyimide layers, can be different from each other. According to an example thereof, the method may further comprise depositing a first dielectric layer and treating the deposited first dielectric layer with a first set of conditions, and depositing a second dielectric layer and treating the deposited second dielectric layer with a second set of conditions, wherein the first set of conditions is different from the second set of conditions. As a further example thereof, the first set of conditions comprises a first heating temperature and a first heating time, and the second set of conditions comprises a second heating temperature and a second heating time. If, for example, the first dielectric layer is comprised of a first polyimide layer and the first heating temperature is in a range between 300° C. and 350° C., the result will be a polyimide layer with a degree of imidization equal to or near to 100%. If then, for example, the second dielectric layer is also comprised of a polyimide layer and the second heating temperature is in a range between 200° C. and 250° C., then the result will be a second polyimide layer having a degree of imidization significantly less than 100%, i.e. 95% or even less than that. It is also possible to choose the same heating temperatures for the two different layers, but different heating times. Moreover, the described variant of depositing two or more dielectric layers and treating them with different conditions can also be applied to the other materials mentioned above for use as dielectric layer. According to a specific example, a first lower layer can be a silicone layer and a second upper layer can be a polyimide layer.

According to an example of the method of the first aspect, applying the encapsulant comprises applying a host material comprising one or more of a resin, in particular an epoxy resin, an epoxy silicone, or an epoxy polyimide, a bismaleimide, a cyanate ester, or a thermoplast. According to an example thereof, the host material comprises filler increments embedded therein, wherein the filler increments can be made of SiO, Al2O3, MgO, AlN, Si3N4, BN, or another ceramic material. The filler increments can also be selected such that they fulfill particular functions like, for example, ion catching, flame inhibiting, softening or plasticizing, or stress releasing.

According to an example of the method of the first aspect, applying the encapsulant comprises one of transfer molding, compression molding, vacuum casting, or laminating.

According to an example of the method of the first aspect, the encapsulant is applied with a thickness in a range from 0.1 mm to 10 mm, in particular from 1 mm to 5 mm. It should be noted in this respect that in most cases the encapsulant is applied to a surface which is not planar but instead a more or less complex three-dimensional structure so that the above values may refer to a thickness of the encapsulant above any location of this three-dimensional structure.

According to an example of the method of the first aspect, after applying the dielectric layer, i.e. after depositing and curing of the dielectric layer, a post-treatment can be carried out in order to increase the surface purity and hence increase the adhesion properties of the dielectric layer with respect to the later to be deposited encapsulation layer. The post-treatment may comprise, for example, a plasma treatment or plasma activation for increasing the adhesion conditions for the encapsulation layer. The post-treatment may instead or in addition comprise the deposition of a special adhesion promotor layer which can be, for example, a silane layer or a zinc chromium oxide layer.

According to an example of the method of the first aspect, the dielectric layer can be structured so that it contains openings or through-holes of any desired lateral dimensions and numbers. If the dielectric layer is deposited as a whole like, for example, in the form of a laminate layer, the structuring can be carried out before depositing the laminate layer or after depositing the laminate layer. If the dielectric layer is deposited in a sequential manner with anyone of the methods as described above, the structuring may be carried out during the depositing of the dielectric layer by, for example, using a mask having openings, or it may be carried out after depositing of the dielectric layer on the whole area and as a further example thereof it may be carried out either before or after the curing. The structuring can then, for example, be carried out by laser ablation or laser direct imaging or by photolithographic or lift-off techniques.

According to an example of the method of the first aspect, the semiconductor chips each comprise a transistor comprising a gate contact, an emitter contact, and a collector contact, and the transistors are each configured to function with an emitter collector voltage above 1200 V. However, the present disclosure is not limited to this voltage range and is also applicable in the voltage class below 1200 V or, for example, in the automotive, aerospace, or medical area, or in general in technological areas in which reliability is an important factor or even the most important factor.

According to an example of the method of the first aspect, the carrier can be an auxiliary or temporary carrier which is removed after applying the encapsulant so that the carrier will not be part of the fabricated electronic device package.

According to an example of the method of the first aspect, the carrier will not be removed and will be part of the fabricated electronic device package in which case the carrier functions as a chip carrier. The chip carrier can be a conductive carrier like, for example, a metal carrier, a copper plate, a molybdenum plate, or a leadframe, or a direct copper bond (DCB), or an insulated metal substrate (IMS). It should be mentioned, however, that also in this case an additional auxiliary or temporary carrier can be used onto which the chip carrier is disposed. This offers the possibility to apply different kinds of chip carriers onto the auxiliary or temporary carrier. Lateran the chips or chip modules can be encapsulated on 5 sides, i.e. at their 4 side faces and on their upper main face.

Figures 2A, 2B, 2C:
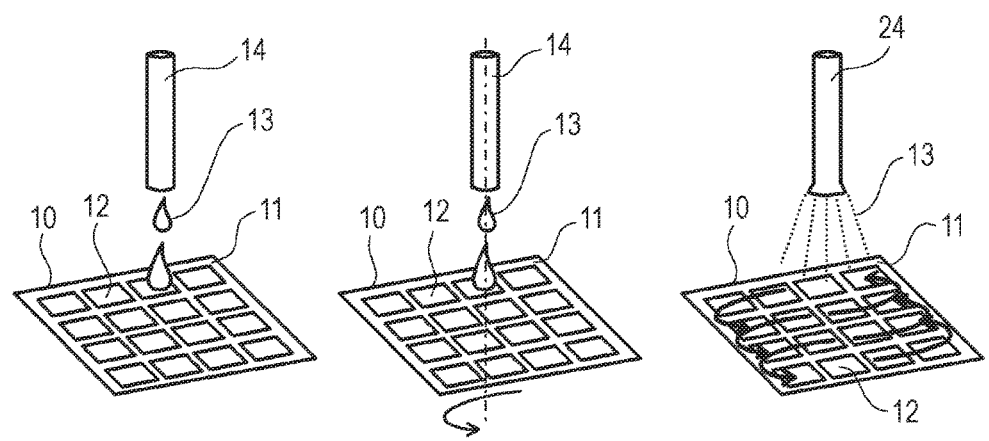
FIGS. 2A-2E illustrate in schematic form examples of applying a dielectric layer onto a carrier, in particular depositing a material of a dielectric layer onto the carrier, including potting/filling (2A), spin coating (2B), spray/jet coating or electrostatic and/or atomizing coating (2C), laminating (2D), and dipping (2E).
Figures 2D, 2E:
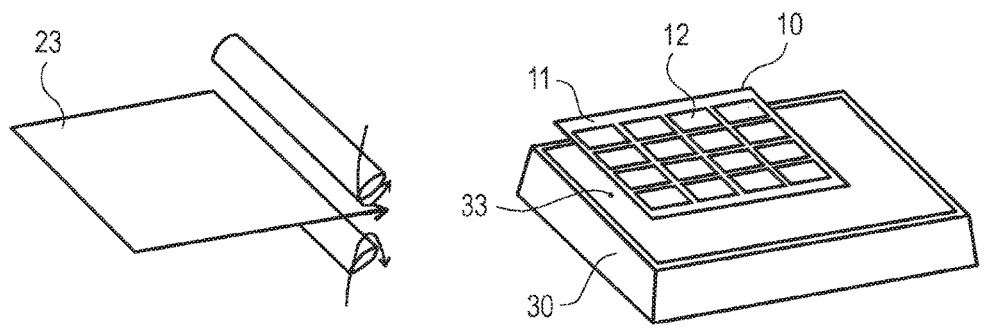

FIGS. 2A-2E show in a schematic form different methods of depositing the dielectric layer. In FIGS. 2A-2D, an electronic device module 10 is shown which comprises a carrier 11 and a plurality of semiconductor chips 12 disposed on the carrier 11. Moreover, electrical contact elements (not shown) are disposed onto the semiconductor chips 12. FIG. 2A shows a process of potting or filling of a liquid dielectric material 13 onto the electronic device module 10. A dispenser 14 is positioned above the electronic device module 10 and delivers the liquid material 13 onto the upper main surface of the electronic device module 10 where the liquid material 13 is distributed over the entire upper surface. FIG. 2B shows a process of spin coating where essentially in addition to the process of FIG. 2A, the electronic device module 10 is rotated around a vertical axis as shown by the arrow in order to optimally distribute the liquid material 13 on the upper surface of the electronic device module 10. FIG. 2C shows a process of spray or jet coating of the liquid or partly dried material 13 by using a dispenser 24 which is able to deliver the liquid material 13 in the form of a spray jet which extends over a spatial angle in order to cover a certain area of the upper surface of the electronic: device module 10. In addition, either the dispenser 24 or the electronic device module 10 can be moved laterally as indicated by the arrows. FIG. 2D shows a method of laminating the dielectric layer onto the electronic device module 10. In this method, a prefabricated dielectric laminate foil 23 is deposited onto the upper surface of the electronic device module 10 by use of an adhesion agent. FIG. 2E shows a process of dipping the electronic device module 10 into a container which contains a liquid 33 of the dielectric material to be deposited. The dielectric material will adhere to the upper surface of the electronic device module 10 after dipping it into the bath of the liquid 33.

It should be mentioned that in the representation of FIGS. 2A-2E the reference sign 12 can also refer to semiconductor modules including each a plurality of semiconductor chips and the reference sign 10 can refer to a chip carrier panel having deposited thereon a plurality of such semiconductor modules 12. At the end of the fabrication process or after encapsulating the chip carrier panel, an encapsulant panel is obtained and the encapsulant panel can be singulated to obtain a plurality of individual semiconductor modules 12. It is also possible not to encapsulate the chip carrier panel but to singulate the chip carrier panel after the deposition of the dielectric layer and thereafter to encapsulate the individual semiconductor modules. This can be carried out by placing the individual semiconductor modules onto a temporary carrier, and then applying an encapsulant onto the temporary carrier and the semiconductor modules, thereby obtaining an encapsulant panel. Thereafter the encapsulant panel can be singulated into a plurality of encapsulated semiconductor modules.

Furthermore in the representation of FIGS. 2A-2E, the semiconductor chips 12 are not necessarily identical and not necessarily transistor chips. They can also be, for example, sensor chips or logic chips in which way an intelligent power module (IPM) as was mentioned above is created.

Depending on the material of the dielectric layer, also other methods of depositing like, for example, vacuum lamination or printing can be employed. In case of, for example, parylene as material of dielectric layer, physical vapor deposition (PVD) or electrostatic and/or atomizing coating or ion atomizing can be used for depositing the parylene layer. The dielectric material can also be deposited in the form of a granulate, in particular a plastic granulate. In other cases, also chemical vapor deposition (CVD) may be used as the deposition method.

As already described above, after depositing the dielectric layer it may be cured at a temperature in a range from 200° C. to 400° C. in, for example, a batch furnace for a curing time in a range from 1 h to 4 h. The curing atmosphere can be nitrogen ($N_2$) with low vacuum and/or higher vacuum of 500 mbar or even below or above that. This process step generates and guarantees the final material properties through imidization, polymerization, x-linking polymer molecules or atoms or any sort of chemical reaction in general. Before this curing process the dielectric layer can be pre-baked and a surface treatment like, for example, plasma activation, a wet chemical treatment or applying an adhesion promoter, can be performed before applying the encapsulant. The pre-baking will ensure solvent evaporation and humidity outgassing and the plasma activation will ensure sufficient adhesion between the dielectric layer and the encapsulant material.

FIGS. 3A-3D show schematic cross-sectional side view representations for illustrating an exemplary method of the first aspect. According to FIG. 3A, a chip carrier 30 is provided which may be comprised of a leadframe or a copper plate in this example. The chip carrier 30 can also be applied onto an auxiliary or temporary carrier which is not shown in the Figure for reasons of clarity. It is possible to dispose different kinds of chip carriers 30 onto the auxiliary carrier, for example in case that a panel comprising a plurality of semiconductor modules is to be fabricated on the auxiliary carrier. The auxiliary carrier can be removed later in the fabrication process. Onto the chip carrier 30 a plurality of semiconductor chips 32 is deposited by use of an intermediate solder or adhesion layer 31. The chips 32 may have electrical contact pads 32A on their upper surface and in case of, for example, vertical transistors also on their lower surface. On the upper surface of the chips 32 a contact element 33 is applied onto a contact pad 32A. The contact elements 33 may have the form of spacer elements and may be fabricated by copper either galvanically plated or applied as a whole in the form of copper plates. The contact pad 32A can be, for example, an emitter contact pad of an insulated gate bipolar transistor (IGBT). A gate contact element of the IGBT can also be provided on the upper surface of the semiconductor chips 32 (not shown) and a gate contact layer can be applied which provides connections to all gate contact pads of the semiconductor chips 32.

Figure 3A:
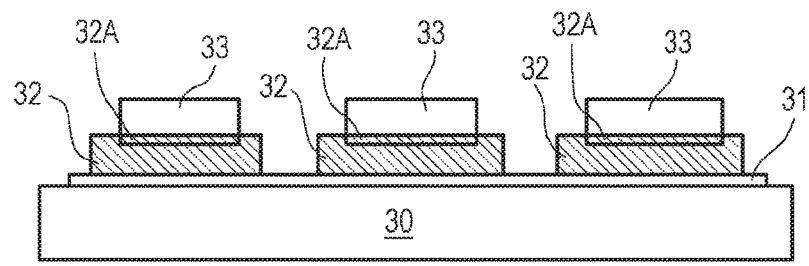
FIGS. 3A-3D show schematic cross-sectional side view representations for illustrating an exemplary method for fabricating an electronic device package according to the first aspect wherein a copper plate or a leadframe is used as a carrier.
Figure 3B:
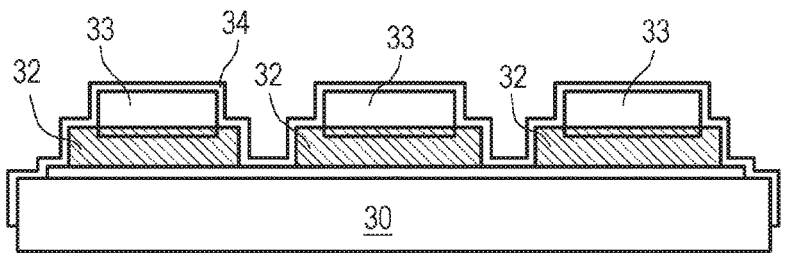

According to FIG. 3B, a dielectric layer 34 is deposited onto the upper surfaces of the intermediate product as shown in FIG. 3A, i.e. onto the upper surfaces of the contact elements 33, the semiconductor 32, the solder layer 31, and the carrier 30, by anyone of the deposition methods as described before.

Figure 3C:
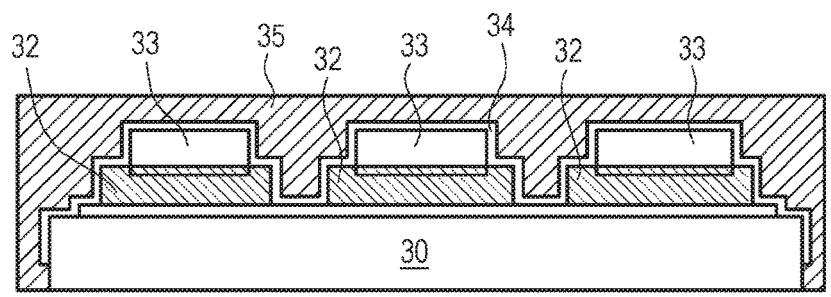

According to FIG. 3C, after curing of the dielectric layer 34 an encapsulation layer or encapsulant 35 is deposited onto the intermediate product as shown in FIG. 3B. The encapsulant 35 can be applied by, for example, transfer molding, compression molding, vacuum casting, or laminating.

Figure 3D:
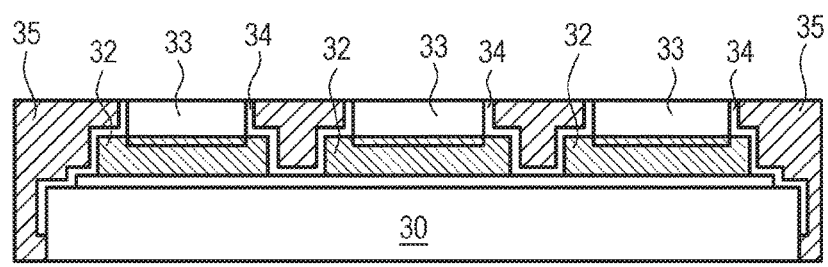

According to FIG. 3D, the encapsulation layer 35 is partly removed from above by, for example, grinding in order to expose the contact elements 33 so that they can be connected to further outside electrical connectors. As will be seen in the next example, grinding is not essential and also other measures can be taken to connect the contact elements 33 to the outside electrical connectors.

FIGS. 4A-4D show schematic cross-sectional side view representations for illustrating an exemplary method for fabricating an electronic device package according to the first aspect. According to FIG. 4A, a carrier 40 is provided in the form of, for example, a direct bonded copper (DCB) 40. The DCB 40 comprises a substrate 40A comprising an insulating, dielectric or ceramic layer or tile, and a first metallic layer 40B on a lower surface of the substrate 40A and a second metallic layer 40C on an upper surface of the substrate 40A. According to an example the carrier 40 may comprise one or more of a direct copper bonded (DCB) substrate, a direct aluminum bonded (DAB) substrate, and an active metal brazing substrate, wherein the substrate may comprise a ceramic layer, in particular one or more of AlN, $Al_2O_3$, or a dielectric layer, in particular $Si_3N_4$. The carrier 40 can also refer to an isolated metal substrate (IMS) in which similar to a DCB an intermediate insulating layer is sandwiched between two metallic layer wherein the intermediate insulating layer comprises a composite of a host material, in particular with filler increments like, for example, BN increments or any other increments as were mentioned above in connection with the encapsulant. The host material can be anyone of the materials which are mentioned within the present disclosure in connection with the encapsulant. DCB and IMS allow electrical isolation to a heatsink and at the same time good heat transfer to the heatsink, and also electrical isolation between the semiconductor chips applied onto the DCB or IMS.

Semiconductor chips 42 are deposited on an upper surface of the carrier 40 by use of an intermediate solder or adhesive layer 41 in the same way as it is described in connection with FIG. 3A. Furthermore, electrical contact elements 43 are attached to contact pads 42A of the semiconductor chips 42 which as well corresponds to the disposing of contact elements described previously in connection with FIG. 3A.

Figure 4A:
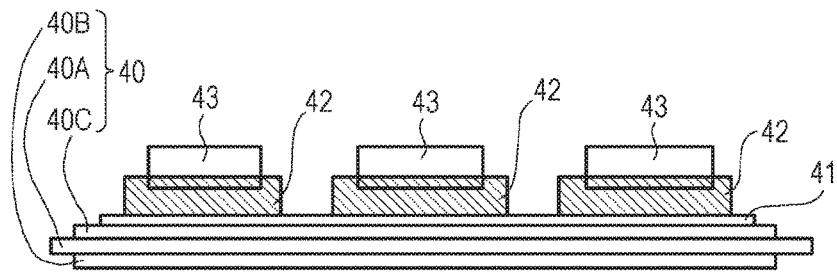
FIGS. 4A-4D show schematic cross-sectional side view representations for illustrating an exemplary method for fabricating an electronic device package according to the first aspect wherein a directed bonded copper (DCB) or an insulated metal substrate (IMS) is used as a carrier.
Figure 4B:
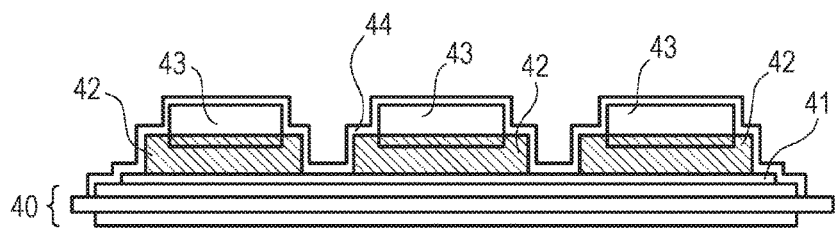

According to FIG. 4B, a dielectric layer 44 is deposited onto the intermediate product of FIG. 4A in the same way as described above in connection with FIG. 3B.

Figure 4C:
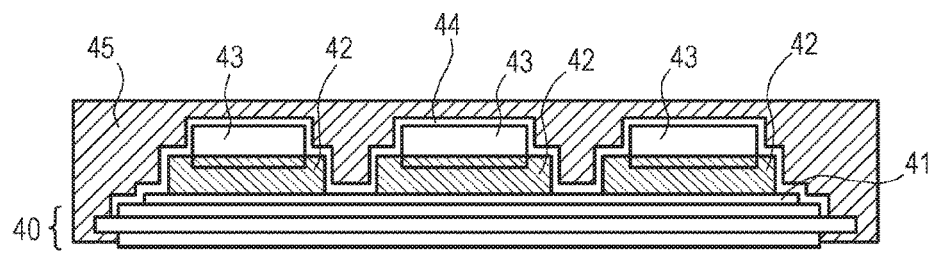

According to FIG. 4C, an encapsulation layer or encapsulant 45 is applied to the intermediate product of FIG. 4B in the same way as described above in connection with FIG. 3C.

According to FIG. 4D, openings 45A are formed in an upper surface of the encapsulant 45, the openings 45A extending from the upper surface down to the electrical contact elements 43 in order to allow connecting the contact elements 43 to further outside electrical connectors in a later step. The forming of the openings 45A can be carried out by laser drilling, which is capable to remove or ablate not only the material of the encapsulant 45 but also the material of the dielectric layer 44.

Figure 4D:
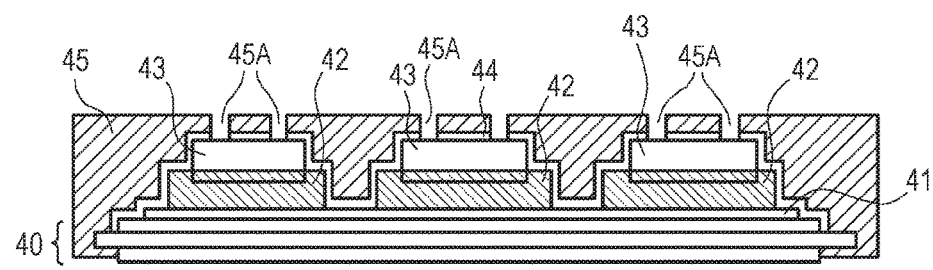
Figure 5A:
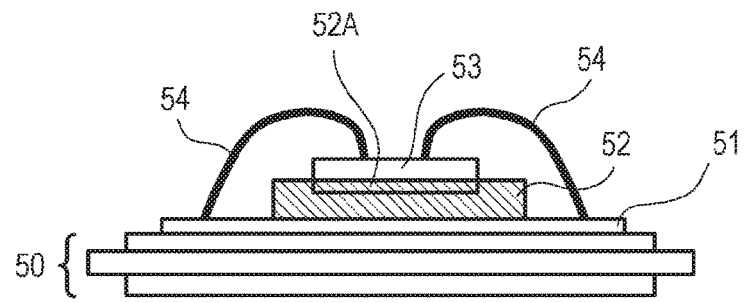
FIGS. 5A-5C show schematic cross-sectional side view representations for illustrating an exemplary method for fabricating an electronic device package wherein a directed bonded copper (DCB) or an insulated metal substrate (IMS) is used as a carrier and wire bonds are used for connecting an upper contact element with the DCB or IMS.
Figure 5B:
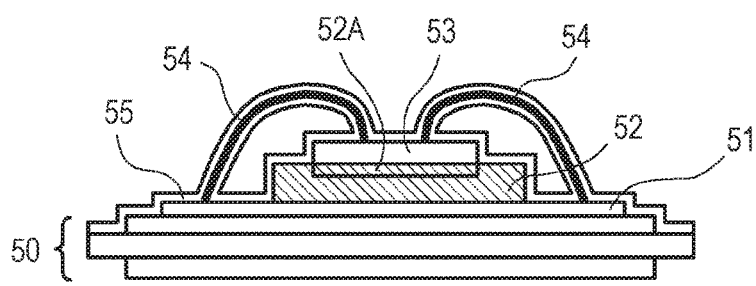
Figure 5C:
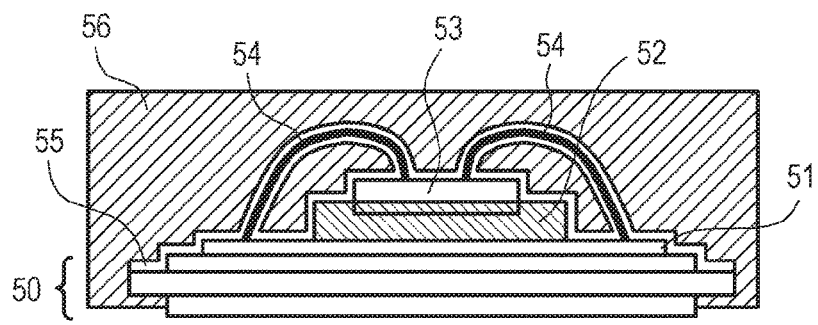

FIGS. 5A-5C show schematic cross-sectional side view representations for illustrating an exemplary method for fabricating an electronic device package according to the first aspect. According to FIG. 5A, a carrier 50 may be provided which may be similar or equal to the carrier 40 of FIGS. 4A-4D and can thus have the form of a DCB. The carrier 50 can, however, also be similar or equal to the carrier 30 of FIGS. 3A-3D. A semiconductor chip 52 is deposited onto an upper surface of the carrier 50 by use of an intermediate solder or adhesive layer 51 in the same way as described before in connection with FIG. 3A or FIG. 4A. Instead of just one semiconductor chip 52 also a plurality of semiconductor chips 52 can be applied onto the upper surface of the carrier 50. An electrical contact element 53 is applied to a contact pad 52A of the semiconductor chip 52 in the same way as described before in connection with FIGS. 3A and 4A. A bond wire 54 is then connected between the contact element 53 and an upper surface of an area of the carrier 50. Another bond wire 54 can be connected between another contact element 53 and an upper surface of another area of the carrier 50. It should be mentioned that instead of a bond wire 54 also a clip could be applied as an electrical connection between the contact element 53 and an upper surface of an area of the carrier 50.

According to FIG. 5B, a dielectric layer 55 is then deposited onto an upper surface of the intermediate product of FIG. 5A in the same way as described before in connection with FIGS. 3B and 4B. As a result, the dielectric layer 55 is also applied to the upper surfaces of the bond wires 54.

According to FIG. 5C, an encapsulation layer 56 is applied to the intermediate product of FIG. 5B in the same way as described before in connection with FIGS. 3C and 4C.

The present disclosure also relates to an electronic device package according to a second aspect. The electronic device package according to the second aspect comprises a carrier, at least one semiconductor chip disposed on the carrier, the semiconductor chip comprising at least one contact pad on a main face thereof remote from the carrier, a contact element disposed on the contact pad, a dielectric layer disposed on or above the carrier, the semiconductor chip, and the contact element, and an encapsulation layer disposed on the dielectric layer.

Further examples of the electronic device package according to the second aspect can be formed by incorporating examples or features which were described before in connection with the method according to the first aspect.

The electronic device package according to the second aspect may, for example, have a form such as that shown in FIG. 3D, 4D or 5C comprising, respectively, a carrier 30, 40 or 50, at least one semiconductor chip 32, 42 or 52, having a contact pad 32A, 42A or 52A, a contact element 33, 43 or 53, a dielectric layer 34, 44 or 55, and an encapsulation layer 35, 45 or 56.

Figure 6:
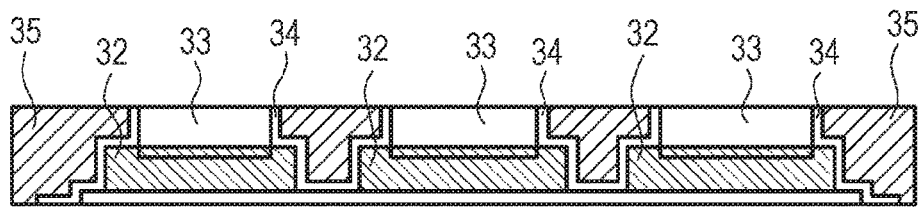
FIG. 6 shows a schematic cross-sectional side view representation of an electronic device package fabricated by the method as illustrated in FIGS. 3A-3D wherein the carrier was removed after encapsulation.
Figure 7:
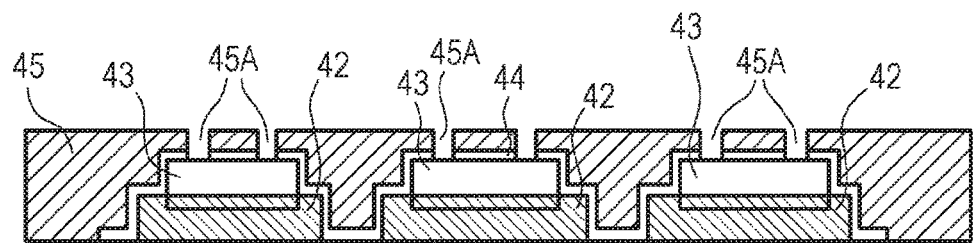
FIG. 7 shows a schematic cross-sectional side view representation of an electronic device package fabricated by the method as illustrated in FIGS. 4A-4D wherein the carrier was removed after encapsulation.
Figure 8:
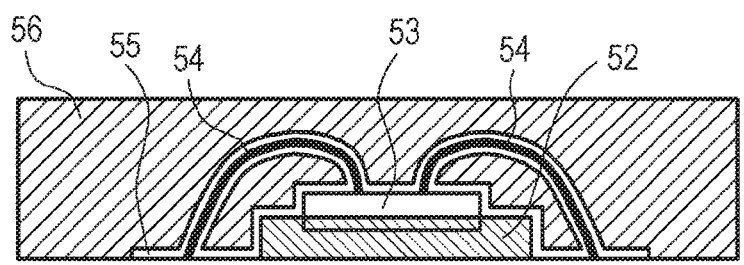
FIG. 8 shows a schematic cross-sectional side view representation of an electronic device package fabricated by the method as illustrated in FIGS. 5A-5C wherein the carrier was removed after encapsulation.

The electronic device package according to the second aspect may also have a form such as that shown in FIG. 6, 7 or 8 which refer to the case that the respective carriers 30, 40 or 50 as shown in FIGS. 3D, 4D, and 5C were only used as auxiliary carriers which were removed after encapsulating. FIG. 6 corresponds to FIG. 3D, FIG. 7 corresponds to FIG. 4D and FIG. 8 corresponds to FIG. 5C, respectively, wherein all reference signs were taken over and have the same meaning as before.

The present disclosure also relates to an electronic voltage converter module according to a third aspect. The electronic voltage converter module, according to the third aspect, comprises an electronic device package according to the second aspect, wherein the semiconductor chips are semiconductor transistor chips which are electrically interconnected to form one or more of a motor drive circuit, a half-bridge circuit, an AC/AC converter circuit, a DC/AC converter circuit, a DC/DC converter circuit, and a buck converter circuit.

Further examples of the electronic voltage converter module according to the third aspect can be formed by incorporporating examples and features which were described before in connection with the method according to the first aspect or the electronic device package according to the second aspect.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating an electronic device package, the method comprising:
   providing a carrier;
   disposing a semiconductor chip onto the carrier, the semiconductor chip comprising a contact pad on a main face of the semiconductor chip;
   applying a contact element onto the contact pad;
   applying a dielectric layer on the carrier, the semiconductor chip, and the contact element; and
   applying an encapsulant onto the dielectric layer.

2. The method of claim 1, wherein the dielectric layer comprises one or more of a polymer layer, polyimide layer, a parylene layer, a polybenzoxazole layer, an epoxy resin layer, a silicone layer, a spin-on glass layer, a semiconductor oxide layer, a semiconductor nitride layer and a semiconductor oxynitride layer.

3. The method of claim 1, wherein the dielectric layer comprises one or more of the following properties:
   a dielectric constant in a range from 2 to 5;
   a dielectric strength in a range from 100 V/μm to 500 V/μm;
   a dissipation factor in a range from 0.005 to 0.03; and
   a modulus of elasticity in a range from 0.1 to 5.0 GPa.

4. The method of claim 1, wherein the dielectric layer is applied with a thickness in a range from 2 μm to 100 μm.

5. The method of claim 1, wherein applying the dielectric layer comprises one or more of:
   spin coating;
   spray coating;
   jet coating;
   electrostatic coating and/or atomizing coating or ion atomizing;
   wave coating;
   potting;
   filling;
   laminating;
   dipping;
   physical vapor deposition;
   chemical vapor deposition; and
   printing.

6. The method of claim 1, further comprising:
   heating or curing the deposited dielectric layer at a heating temperature in a range up to 500° C. and a heating time in a range up to 5 h.

7. The method of claim 1, wherein applying the dielectric layer comprises:
   applying a stack of two or more dielectric layers of one or more of different materials or of different properties.

8. The method of 1, wherein applying the dielectric layer comprises:
   depositing a first dielectric layer and treating the deposited first dielectric layer with a first set of conditions; and
   depositing a second dielectric layer and treating the deposited second dielectric layer with a second set of conditions different from the first set of conditions.

9. The method of claim 8, wherein the first set of conditions comprises a first heating temperature and a first heating time, and wherein the second set of conditions comprises a second heating temperature and a second heating time.

10. The method of claim 1, wherein applying the encapsulant comprises:
    applying a host material comprising one or more of a resin, an epoxy silicone, an epoxy polyimide, a bismaleimide, a cyanate ester, and a thermoplast.

11. The method of claim 1, wherein applying the encapsulant comprises:
    applying a host material comprising filler increments embedded therein, the filler increments being made of SiO, Al2O3, ZnO, MgO, AlN, Si3N4, BN, a ceramic material, or a metallic material.

12. The method of claim 1, wherein the encapsulant is applied by transfer molding, compression molding, vacuum casting, or laminating.

\* \* \* \* \*